(12) United States Patent
Wang et al.

(10) Patent No.: US 10,615,174 B2
(45) Date of Patent: *Apr. 7, 2020

(54) ELEVATIONALLY-EXTENDING STRINGS OF MEMORY CELLS INDIVIDUALLY COMPRISING A PROGRAMMABLE CHARGE STORAGE TRANSISTOR AND METHODS OF PROCESSING SILICON NITRIDE-COMPRISING MATERIALS

(71) Applicant: Micron Technology, Inc., Boise, ID (US)

(72) Inventors: Fei Wang, Boise, ID (US); Tom J. John, Boise, ID (US); Kunal Shrotri, Boise, ID (US); Anish A. Khandekar, Boise, ID (US); Aaron R. Wilson, Boise, ID (US); John D. Hopkins, Meridian, ID (US); Derek F. Lundberg, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/435,280

(22) Filed: Jun. 7, 2019

(65) Prior Publication Data
US 2019/0312056 A1    Oct. 10, 2019

Related U.S. Application Data

(60) Continuation of application No. 16/041,388, filed on Jul. 20, 2018, now Pat. No. 10,381,377, which is a (Continued)

(51) Int. Cl.
*H01L 27/11582* (2017.01)
*H01L 21/033* (2006.01)
(Continued)

(52) U.S. Cl.
CPC .... *H01L 27/11582* (2013.01); *H01L 21/0332* (2013.01); *H01L 21/0337* (2013.01);
(Continued)

(58) Field of Classification Search
CPC ........... H01L 27/11582; H01L 27/1156; H01L 21/0332; H01L 21/0337; H01L 21/31116; H01L 21/31144; H01L 29/7883
(Continued)

(56) References Cited

U.S. PATENT DOCUMENTS

| 7,067,385 B2 | 6/2006 | Manning |
| 7,339,273 B2 | 3/2008 | Kameyama et al. |

(Continued)

*Primary Examiner* — Tong-Ho Kim
(74) *Attorney, Agent, or Firm* — Wells St. John P.S.

(57) ABSTRACT

A method comprises forming material to be etched over a substrate. An etch mask comprising a silicon nitride-comprising region is formed elevationally over the material. The etch mask comprises an elevationally-extending mask opening in the silicon nitride-comprising region that has a minimum horizontal open dimension that is greater in an elevationally-innermost portion of the region than in an elevationally-outermost portion of the region. The elevationally-outermost portion has a greater etch rate in at least one of HF and $H_3PO_4$ than does the elevationally-innermost portion. The etch mask is used as a mask while etching an elevationally-extending mask opening into the material. The silicon nitride-comprising region is exposed to at least one of HF and $H_3PO_4$ to increase the minimum horizontal open dimension in the elevationally-outermost portion to a greater degree than increase, if any, in the minimum horizontal open dimension in the elevationally-innermost portion. Other aspects and embodiments, including structure independent of method of manufacture, are disclosed.

11 Claims, 6 Drawing Sheets

Related U.S. Application Data continuation of application No. 15/851,532, filed on Dec. 21, 2017, now Pat. No. 10,121,799, which is a division of application No. 15/293,133, filed on Oct. 13, 2016, now Pat. No. 9,893,083.

(51) Int. Cl.
  *H01L 29/788* (2006.01)
  *H01L 27/11556* (2017.01)
  *H01L 21/311* (2006.01)

(52) U.S. Cl.
  CPC .. *H01L 21/31116* (2013.01); *H01L 21/31144* (2013.01); *H01L 27/11556* (2013.01); *H01L 29/7883* (2013.01)

(58) Field of Classification Search
  USPC .......................................................... 257/314
  See application file for complete search history.

(56) References Cited

U.S. PATENT DOCUMENTS

| | | | |
|---|---|---|---|
| 2012/0248580 A1* | 10/2012 | Matsugai | H01L 22/12 257/621 |
| 2013/0228837 A1 | 9/2013 | Sukekawa et al. | |
| 2013/0248974 A1* | 9/2013 | Alsmeier | G11C 16/04 257/321 |

* cited by examiner

ELEVATIONALLY-EXTENDING STRINGS OF MEMORY CELLS INDIVIDUALLY COMPRISING A PROGRAMMABLE CHARGE STORAGE TRANSISTOR AND METHODS OF PROCESSING SILICON NITRIDE-COMPRISING MATERIALS

RELATED PATENT DATA

This patent resulted from a continuation application of U.S. patent application Ser. No. 16/041,388, filed Jul. 20, 2018, entitled "Elevationally-Extending Strings Of Memory Cells Individually Comprising A Programmable Charge Storage Transistor And Methods Of Processing Silicon Nitride-Comprising Materials", naming Fei Wang, Tom J. John, Kunal Shrotri, Anish A. Khandekar, Aaron R. Wilson, John D. Hopkins, and Derek F. Lundberg as inventor, which was a continuation application of U.S. patent application Ser. No. 15/851,532, filed Dec. 21, 2017, entitled "Elevationally-Extending Strings Of Memory Cells Individually Comprising A Programmable Charge Storage Transistor And Methods Of Processing Silicon Nitride-Comprising Materials", naming Fei Wang, Tom J. John, Kunal Shrotri, Anish A. Khandekar, Aaron R. Wilson, John D. Hopkins, and Derek F. Lundberg as inventors, now U.S. Pat. No. 10,121,799, which was a divisional of U.S. patent application Ser. No. 15/293,133 filed Oct. 13, 2016, entitled "Elevationally-Extending Strings Of Memory Cells Individually Comprising A Programmable Charge Storage Transistor And Methods Of Processing Silicon Nitride-Comprising Materials", naming Fei Wang, Tom J. John, Kunal Shrotri, Anish A. Khandekar, Aaron R. Wilson, John D. Hopkins, and Derek F. Lundberg as inventors, now U.S. Pat. No. 9,893,083, the disclosures of which are incorporated by reference.

TECHNICAL FIELD

Embodiments disclosed herein pertain to elevationally-extending strings of memory cells individually comprising a programmable charge storage transistor and to methods of processing silicon nitride-comprising materials.

BACKGROUND

Memory provides data storage for electronic systems. Flash memory is one type of memory, and has numerous uses in computers and other devices. For instance, personal computers may have BIOS stored on a flash memory chip. As another example, flash memory is used in solid state drives to replace spinning hard drives. As yet another example, flash memory is used in wireless electronic devices as it enables manufacturers to support new communication protocols as they become standardized, and to provide the ability to remotely upgrade the devices for improved or enhanced features.

A typical flash memory comprises a memory array that includes a large number of memory cells arranged in row and column fashion. The flash memory may be erased and reprogrammed in blocks. NAND may be a basic architecture of flash memory. A NAND cell unit comprises at least one selecting device coupled in series to a serial combination of memory cells (with the serial combination commonly being referred to as a NAND string). Example NAND architecture is described in U.S. Pat. No. 7,898,850.

Memory cell strings in flash or other memory may be arranged to extend horizontally or vertically. Vertical memory cell strings reduce horizontal area of a substrate occupied by the memory cells in comparison to horizontally extending memory cell strings, albeit typically at the expense of increased vertical thickness.

Formation of vertically-extending strings of memory cells commonly includes etching of individual channel openings through multiple alternating tiers of material. Multiple materials are then deposited into the channel openings, with the channel material being one of the latter materials so-deposited. The channel material ideally electrically couples with conductive or semiconductive material there-below. Accordingly, the respective materials first-deposited in the channel opening need to be removed from being centrally over the base of the channel opening such that the channel material when it is deposited may make electrical connection with the material at the base of the channel openings. These earlier materials are typically so-removed by exposure to wet isotropic HF and/or $H_3PO_4$ etching. These earlier materials can be difficult to remove from the base of the channel openings. This is particularly so where a silicon nitride-comprising region atop the alternating materials through which the channel openings are formed has less opening width at its elevationally-outermost surface than at its elevationally-innermost surface.

DETAILED DESCRIPTION OF EXAMPLE EMBODIMENTS

Embodiments of the invention include methods of processing silicon nitride-comprising materials. Such method embodiments are described with respect to fabrication of an array of elevationally-extending strings of memory cells, although such may occur in processing any silicon nitride-comprising material regardless of resulting integrated circuit construction or resulting construction that may not include integrated circuitry. Embodiments of the invention also include elevationally-extending strings of memory cells independent of method of manufacture, with the memory cells individually comprising a programmable charge storage transistor. In this document, "elevationally-extending" and "extend(ing) elevationally" refer to a direction that is angled away by at least 45° from a primary surface relative to which a substrate is processed during fabrication and which may be considered to define a generally horizontal direction. Further, "vertical" and "horizontal" as used herein are generally perpendicular directions relative one another independent of orientation of the substrate in three dimensional space. Further and unless otherwise stated, "elevational(ly)", "higher", "upper", "lower", "top", "atop", "bottom", "above", "below", "under", "beneath", "up", and "down" are generally with reference to the vertical direction. Also, "elevationally-extending" and "extend(ing) elevationally" with respect to a field effect transistor are with reference to orientation of the transistor's channel length along which current flows in operation between the source/drain regions.

Figure 1:
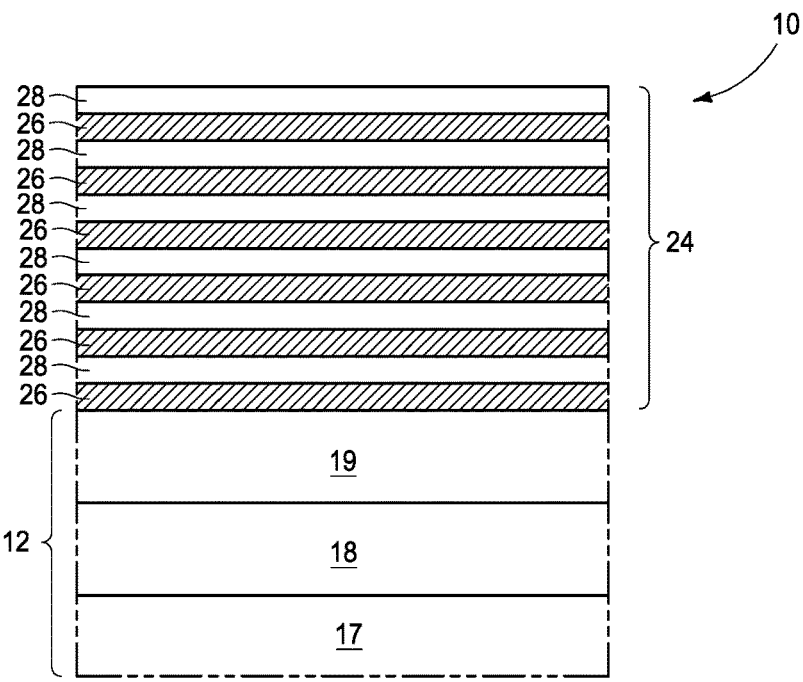
FIG. 1 is a diagrammatic sectional view of a substrate fragment in process in accordance with an embodiment of the invention.

Referring to FIG. 1, a substrate fragment or construction 10 may be considered as comprising a base substrate 12 that may include any one or more of conductive/conductor/conducting (i.e., electrically herein), semiconductive, or insulative/insulator/insulating (i.e., electrically herein) materials. Various materials are shown above base substrate 12. Materials may be aside, elevationally inward, or elevationally outward of the FIG. 1-depicted materials. For example, other partially or wholly fabricated components of integrated circuitry may be provided somewhere above, about, or within substrate 12. Control and/or other peripheral circuitry for operating components within a memory array may also be fabricated, and may or may not be wholly or partially within a memory array or sub-array. Further, multiple sub-arrays may also be fabricated and operated independently, in tandem, or otherwise relative one another. As used in this document, a "sub-array" may also be considered as an array. Regardless, any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Example substrate 12 comprises semiconductor material 17, for example monocrystalline silicon, having a conductively doped source material 19 formed there-over or therein and which may comprise a portion of circuitry for the elevationally-extending strings of memory cells being fabricated. An insulator 18 (e.g., doped or undoped silicon dioxide and/or silicon nitride) is shown elevationally between semiconductor material 17 and material 19. An example source material 19 is conductively doped polysilicon of 500 Angstroms thickness over an underlying tungsten silicide of 900 Angstroms thickness. An example thickness for insulator 18 is 2,000 to 5,000 Angstroms. In this document, "thickness" by itself (no preceding directional adjective) is defined as the mean straight-line distance through a given material or region perpendicularly from a closest surface of an immediately adjacent material of different composition or of an immediately adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

A stack 24 of material to be etched has been formed over substrate 12 and comprises vertically-alternating tiers of control gate material 26 and insulative material 28 (e.g., doped or undoped silicon dioxide and/or silicon nitride). Control gate material 26 is conductive, with an example being conductively doped polysilicon. Example thicknesses for each of materials 26 and 28 are 200 to 400 Angstroms, and such need not be of the same respective thicknesses or of the same thickness relative one another when materials 26 and 28 individually are of constant thickness. Material stack 24 is shown as having twelve vertically-alternating tiers, although fewer or likely many more (e.g., dozens, hundreds, etc.) may be formed. The top layer of material 28 of material stack 24 may be made thicker or thinner than shown or an alternate material provided there-over (not shown in FIG. 1) where desired as an etch-stop or polish-stop for better assuring a planar horizontal substrate (if desired).

Figure 2:
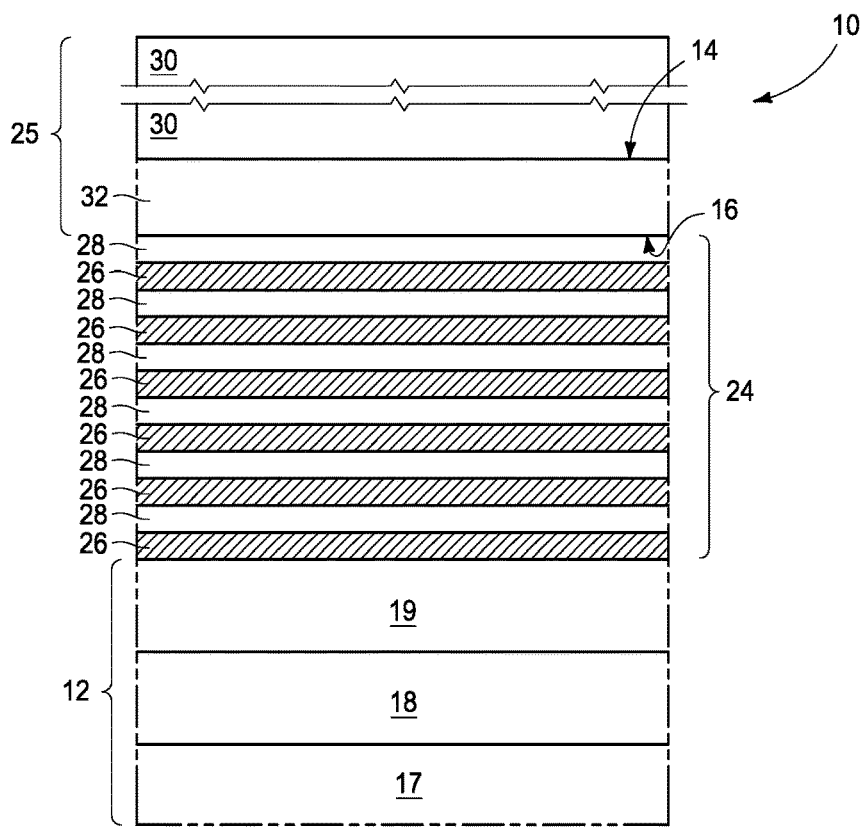
FIG. 2 is a view of the FIG. 1 substrate at a processing step subsequent to that shown by FIG. 1.

Referring to FIG. 2, an etch mask 25 has been formed elevationally over material 24. Such as a minimum has a silicon nitride-comprising region 32 that may comprise, consist essentially of, or consist of silicon nitride. In one embodiment, silicon nitride-comprising region 32 is in a lower or lowest portion of etch mask 25, and in one embodiment as shown is directly against material 24. Example thickness for silicon nitride-comprising region 32 is 500 to 2,000 Angstroms, with 1,100 Angstroms being a specific example. Etch mask 25 is shown as comprising a hard masking material 30 (e.g., amorphous carbon) formed elevationally over silicon nitride-comprising region 32. An example thickness for material 30 is 2,000 to 5,000 Angstroms. For purposes of the continuing discussion, silicon nitride-comprising region 32 may be considered as comprising an elevationally-outermost surface 14 and an elevationally-innermost surface 16. Each is shown as being planar, although need not be so. Regardless, silicon nitride-comprising region 32 has an elevationally-outermost portion having a greater etch rate in at least one of HF and $H_3PO_4$ than does an elevationally-innermost portion of silicon nitride-comprising region 32, and which is described in more detail below.

Figure 3:
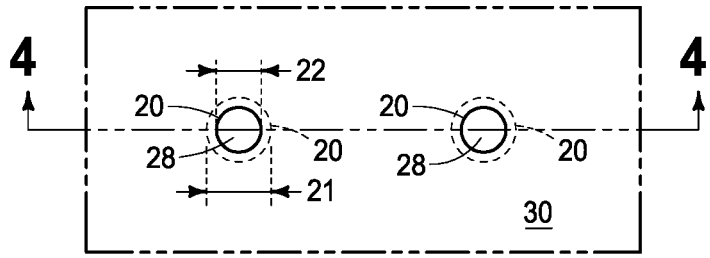
FIG. 3 is a diagrammatic top plan view of the FIG. 2 substrate at a processing step subsequent to that shown by FIG. 2.
Figure 4:
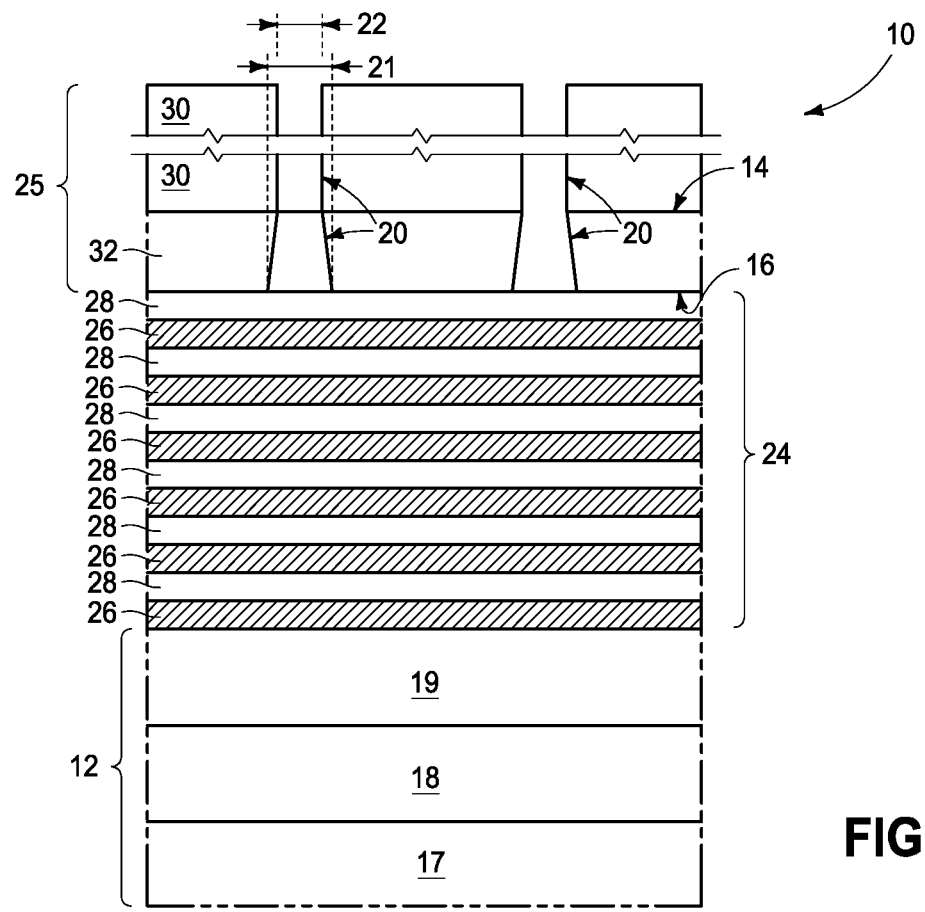
FIG. 4 is a view taken through line 4-4 in FIG. 3.

Referring to FIGS. 3 and 4, elevationally-extending mask openings 20 have been formed in etch mask 25. Only two such mask openings are formed, although likely hundreds, thousands, etc. would be formed for formation of hundreds, thousands, etc. of elevationally-extending strings of memory cells. The discussion proceeds relative to fabrication of a single mask opening 20 for fabrication of a single elevationally-extending string of memory cells. In one embodiment, mask opening 20 is formed to be vertical or within 10° vertical. Example techniques for forming an opening 20 include dry anisotropic plasma etching using lithography with or without pitch multiplication (e.g., using photoresist and/or other imageable and/or non-imageable materials). Mask opening 20 may be circular, ellipsoidal, rectangular, or of other shape in horizontal cross-section, with circular being shown. Mask opening 20 in silicon nitride-comprising region 32 has a minimum horizontal open dimension 21 in an elevationally-innermost portion of region 32 that is greater than a minimum horizontal open dimension 22 in an elevationally-outermost portion of region 32. Such may form, for example, as an artifact in formation of mask opening 20 in region 32. Mask opening 20 within silicon nitride-comprising region 32 is shown as having a straight-linear taper between surfaces 14 and 16, although a curved, stepped, combination of straight and curved, etc. may alternately occur or be provided. Mask opening 20 in hard mask material 30 is shown as being of constant minimum horizontal open dimension 22 although need not be so.

Figure 5:
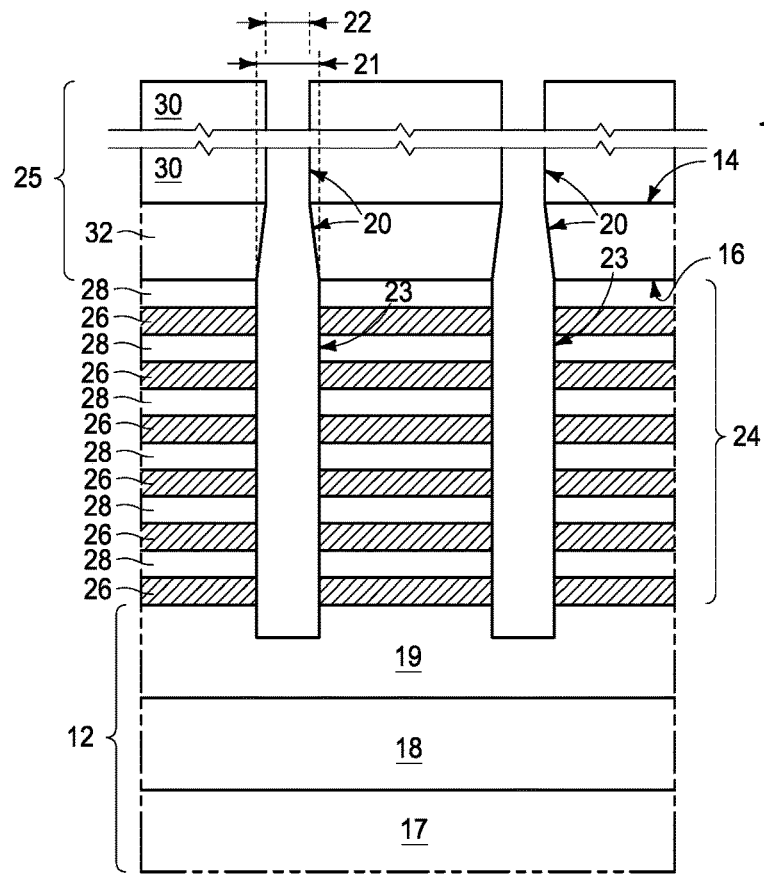
FIG. 5 is a view of the FIG. 4 substrate at a processing step subsequent to that shown by FIG. 4.

Referring to FIG. 5, etch mask 25 has been used as a mask while etching an elevationally-extending opening 23 into material 24. In one embodiment and as shown, opening 23 extends completely through material 24 and partially into material 19. In one embodiment and as shown, opening 23 will comprise a channel opening in which at least channel material will be formed of the programmable charge storage transistors being formed. Opening 23 may have an example maximum horizontal open dimension (e.g., 21) of 850 to 1,250 Angstroms at its elevationally-outermost portion and which tapers (not shown) to a horizontal open dimension of 5 percent to 10 percent less at its elevationally-innermost portion where meeting with source material 19.

Figure 6:
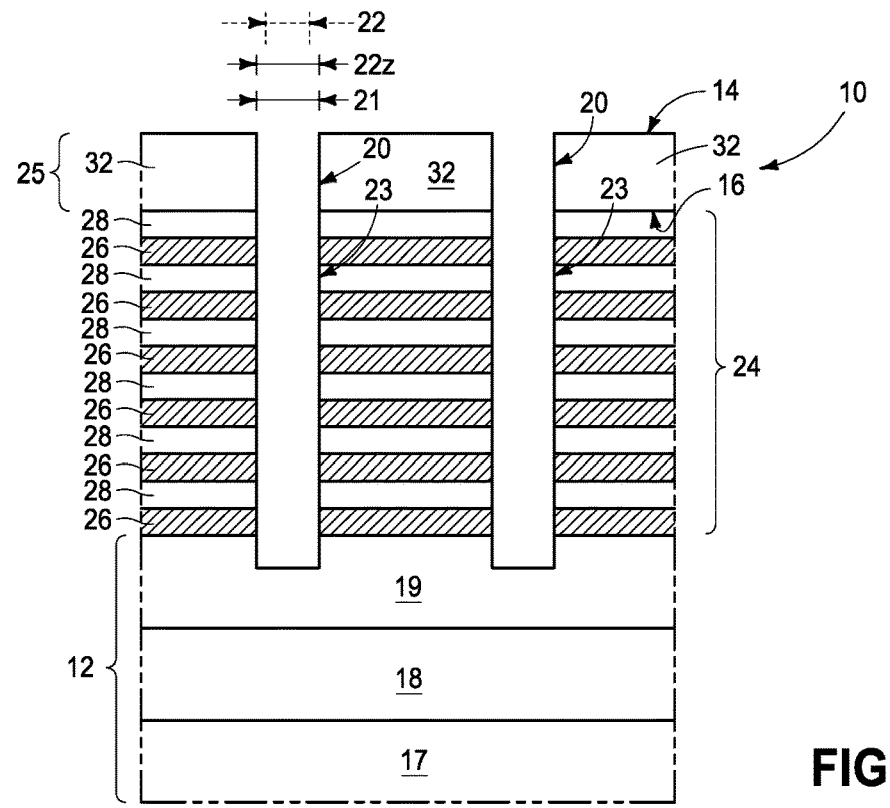
FIG. 6 is a view of the FIG. 5 substrate at a processing step subsequent to that shown by FIG. 5.

Referring to FIG. 6, silicon nitride-comprising region 32 has been exposed to at least one of HF and $H_3PO_4$ to increase horizontal open dimension 22 to dimension 22z in the elevationally-outermost portion thereof to a greater degree than increase, if any, in minimum horizontal open dimension 21 in the elevationally-innermost portion of silicon nitride-comprising region 32. In the depicted example embodiment, and by way of example only, such shows no increase in minimum horizontal open dimension 21 in the elevationally-innermost portion and increase of such dimension in the elevationally-outermost portion to a dimension 22z that is equal to that of open dimension 21, although such may not so-perfectly occur. Masking material 30 (not shown) is shown as having been removed, although such need not occur. Any such removal may occur prior to, after, and/or during exposure of region 32 to at least one of HF and $H_3PO_4$. In one embodiment, however, such is removed prior to exposure of region 32 to at least one of HF and $H_3PO_4$. This will provide exposure of surface 14 of region 32 to the HF and/or $H_3PO_4$, and thereby thickness of silicon nitride-comprising region 32 may be reduced (not shown). In one embodiment, the exposing is to HF, in one embodiment is to $H_3PO_4$, and in one embodiment is to both HF and $H_3PO_4$. Any suitable etching conditions and HF and/or $H_3PO_4$ concentrations may be used. For example and by way of example only, ambient temperature or elevated temperature of a liquid etching solution of volumetric ratio of 10:1 to 1,000:1 water to one or both of HF and $H_3PO_4$ may be used.

Widening of opening 20 in the elevationally-outermost portion of silicon nitride-comprising material 32 may facilitate access of HF and/or $H_3PO_4$ to subsequently deposited materials at the base of channel opening 23 for removal of such materials before formation of the channel material. While the invention was motivated for this purpose in overcoming the problem identified in the "Background" section above, the invention is in no way so-limited.

As stated above, silicon nitride-comprising region 32 is fabricated in a manner such that its elevationally-outermost portion has a greater etch rate in at least one of HF and $H_3PO_4$ than does its elevationally-innermost portion. Such may be achieved by any existing or yet-to-be-developed-manners, with three such example techniques being described below. Specifically, and in a first example and in one embodiment, the elevationally-outermost portion of region 32 is fabricated to have greater intrinsic mechanical stress in the tensile direction than does the elevationally-innermost portion. In one embodiment, the elevationally-outermost portion is fabricated to have intrinsic tensile mechanical stress (e.g., 500 to 1,000 mega-Pascals [mPa]), and in one embodiment the elevationally-innermost portion is fabricated to have intrinsic tensile mechanical stress (e.g., 350 to 850 mPa) yet which is less than that of the elevationally-outermost portion. For example and by way of example only, an elevationally-outermost portion having on average greater intrinsic mechanical stress of at least 150 mPa in the tensile direction in comparison to that of the elevationally-innermost portion may provide a suitable etch rate delta in HF and/or $H_3PO_4$.

Degree of tensile or compressive intrinsic mechanical stress in a silicon nitride-comprising region 32 may be determined or controlled by processing conditions during deposition. For example, consider PECVD of silicon nitride using the following conditions/parameters:

| Process Parameters | Parameter Range |
| --- | --- |
| $SiH_4$ flow | 100-300 sccm |
| $NH_3$ flow | 300-1,000 sccm |
| High frequency RF power | 200-500 Watts |
| Pressure | 2-5 Torr |
| Electrode-wafer spacing | 400-1,000 millimeters |
| Temperature | 450°-500° C. |

With respect to the above parameters, each of less RF power, greater pressure, and greater spacing achieves greater intrinsic mechanical stress in the tensile direction. Accordingly with respect to the above example, ideally, the elevationally-outermost portion of silicon nitride-comprising region 32 is fabricated using less RF power, greater pressure, and greater spacing than is used in fabricating the elevationally-innermost portion of silicon nitride-comprising region 32.

In a second example and in one embodiment, and perhaps independent of intrinsic mechanical stress at least to some degree, carbon content within silicon nitride impacts etch rate within HF and $H_3PO_4$, with greater carbon content resulting in less etch rate than lesser or no carbon content.

Accordingly and in one embodiment, the elevationally-outermost portion of silicon nitride-comprising region 32 is fabricated to have less carbon content, if any, than the elevationally-innermost portion of region 32. In one embodiment, the elevationally-innermost portion has 0.5 to 9 atomic percent carbon, and in one such embodiment 0.5 to 2 atomic percent carbon. In one embodiment, the elevationally-outermost portion has 0 to 0.001 atomic percent carbon.

In a third example and in one embodiment, and perhaps independent of intrinsic mechanical stress at least to some degree, boron content within silicon nitride impacts etch rate in HF and $H_3PO_4$, with greater boron content resulting in greater etch rate than lesser or no boron content. Accordingly and in one embodiment, the elevationally-innermost portion of silicon nitride-comprising region 32 is fabricated to have less boron content, if any, than the elevationally-innermost portion of region 32. In one embodiment, the elevationally-outermost portion has 1 to 20 atomic percent boron, and in one embodiment the elevationally-innermost portion has zero to 0.001 atomic percent boron.

Figure 7:
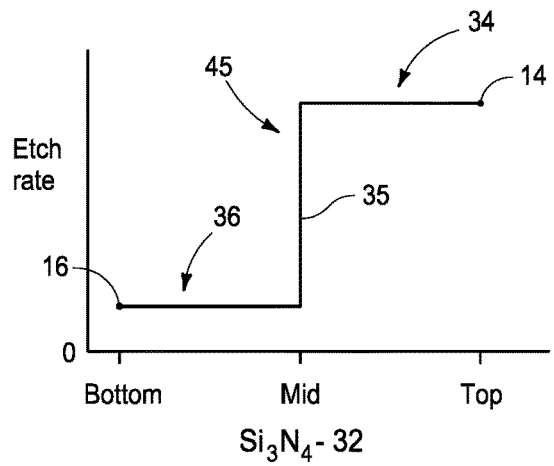
FIG. 7 is a graph diagrammatically representing etch rate and composition as a function of thickness position of a silicon nitride-comprising material in accordance with an embodiment of the invention.

Regardless of which one or more of the above three techniques, or other technique(s), is/are used to achieve an etch rate delta between an elevationally-outermost and elevationally-innermost portion, in one embodiment the respective etch rate is constant elevationally through one or both of the elevationally-outermost portion and the elevationally-innermost portion, and in one alternate embodiment is variable elevationally through one or both of the elevationally-outermost portion and the elevationally-innermost portion. Regardless and in one embodiment, the difference in the etch rate in the elevationally-outermost and elevationally-innermost portions is along a stepped gradient. For example and by way of example only, FIG. 7 shows etch rate and composition as a function of thickness position of silicon nitride-comprising region 32 along a stepped gradient 45. FIG. 7 shows increasing etch rate of silicon nitride by exposure to at least one of HF and $H_3PO_4$, over a set time period, from bottom surface 16 to top surface 14 of a silicon nitride-comprising region 32 fabricated to have an elevationally-outermost portion have a greater such etch rate than does an elevationally-innermost portion. FIG. 7 shows but one example embodiment wherein an elevationally-outermost portion 34 is of the same thickness as an elevationally-innermost portion 36, with the "mid" portion of the x-axis of the graph depicting the middle of the elevational thickness of region 32. Such elevationally-outermost and elevationally-innermost regions may alternately have unequal thicknesses, for example either being larger than the other.

FIG. 7 also shows an embodiment wherein the depicted example etch rate is constant elevationally through each of elevationally-outermost portion 34 and elevationally-innermost portion 36. Such may be accomplished, by way of example, by making the composition of region 32 homogenous, but different, in each of regions 34 and 36 from surface 14, 16, respectively, to the "mid" thickness location. Further, such additionally shows one example embodiment wherein difference in the etch rate between portion 34 and portion 36 is across at least one vertical step wall 35 of stepped gradient 45. Additionally, FIG. 7 shows an example embodiment wherein etch rate of elevationally-innermost portion 36 is greater than zero, although such alternately could be essentially zero throughout the etching time period. Again, method of fabrication and/or the composition of regions 34 and 36 may be tailored to achieve a desired etch profile of region 32, for example as shown in FIG. 7.

Figure 8:
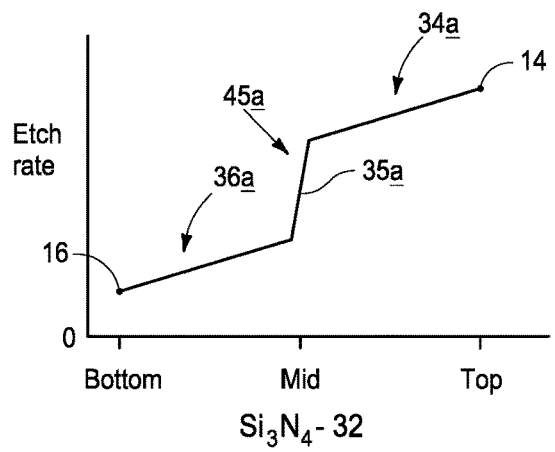
FIG. 8 is a graph diagrammatically representing etch rate and composition as a function of thickness position of a $Si_3N_4$-comprising material in accordance with an embodiment of the invention.

FIG. 8 shows an example alternate embodiment by which region 32 may be fabricated. Like numerals from the above-described embodiments have been used where appropriate, with some differences being indicated with the suffix "a". FIG. 8 shows an embodiment wherein each of an elevationally-innermost portion 36a and an elevationally-outermost portion 34a along a stepped gradient 45a has an etch rate which is variable elevationally through each of elevationally-outermost portion 34a and elevationally-innermost portion 36a, and having a non-vertical step-wall 35a. Such may be accomplished, by way of example, by making the composition of region 32 non-homogenous and different in each region 34 and 36 to achieve the depicted etch rates at the different thickness locations.

Figure 9:
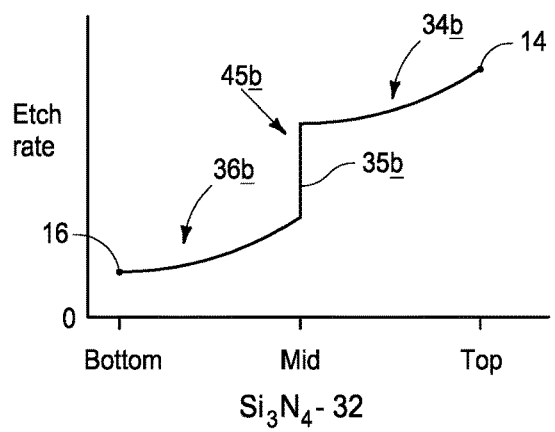
FIG. 9 is a graph diagrammatically representing etch rate and composition as a function of thickness position of a silicon nitride-comprising material in accordance with an embodiment of the invention.

FIG. 8 shows an example embodiment wherein the variability in etch rate is along a linear gradient that is straight-linear in each of portions 34a and 36b. FIG. 9 shows an alternate example embodiment to that of FIG. 8 wherein like numerals are used but for some differences being indicated with the suffix "b". In FIG. 9, the etch rate along a stepped gradient 45b is shown as being variable elevationally through each of elevationally-outermost portion 34b and elevationally-innermost portion 36b along a linear gradient that is curved, and to or from a vertical step wall 35b. Alternate gradients may of course be used, for example along a stepped gradient in one or both of portions 34b and 36b (not shown). Further, any combination of the disclosed and shown features of FIGS. 7-9 (and FIGS. 10-12 described below) may be used.

Figure 10:
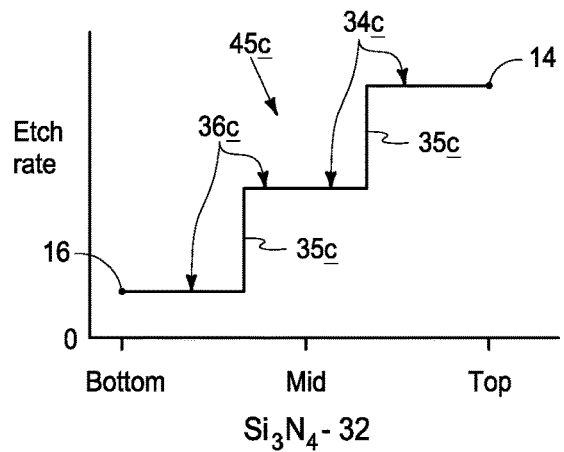
FIG. 10 is a graph diagrammatically representing etch rate and composition as a function of thickness position of a silicon nitride-comprising material in accordance with an embodiment of the invention.

FIG. 10 shows another example embodiment for the fabrication of silicon nitride-comprising region 32. Like numerals from the above-described embodiments have been used where appropriate, with some construction differences being indicated with the suffix "c". In FIG. 10, silicon nitride-comprising region 32 has been formed with outermost and innermost portions 34c and 36c, respectively, collectively having three steps and two step walls 35c in a stepped gradient 45c between elevationally-outermost surface 14 and elevationally-innermost surface 16.

Figure 11:
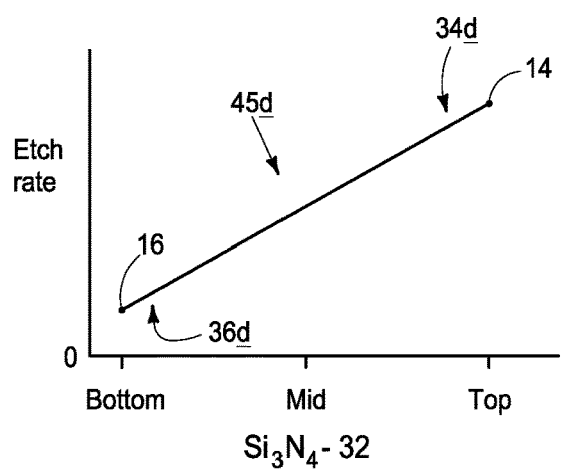
FIG. 11 is a graph diagrammatically representing etch rate and composition as a function of thickness position of a silicon nitride-comprising material in accordance with an embodiment of the invention.
Figure 12:
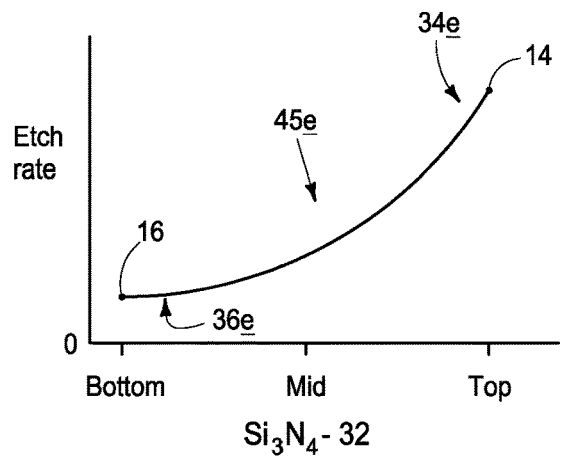
FIG. 12 is a graph diagrammatically representing etch rate and composition as a function of thickness position of a silicon nitride-comprising material in accordance with an embodiment of the invention.

The above example FIGS. 7-10 embodiments show difference in etch rate between the elevationally-outermost and elevationally-innermost portions as being along a gradient that includes a step (i.e., being along a stepped gradient) at least due to presence of step walls 35/35a/35b/35c. Alternately, difference in etch rate between the elevationally-outermost and elevationally-innermost portions may be along a linear gradient (i.e., which is not a stepped gradient), for example as shown by way of examples only in FIGS. 11 and 12. FIG. 11 shows an embodiment wherein a linear gradient 45d between elevationally-innermost surface 16 and elevationally-outermost surface 14 is straight-linear, with FIG. 12 showing an example embodiment wherein a linear gradient 45e is curved from elevationally-innermost surface 16 to elevationally-outermost surface 14. Alternate degrees of etch rate delta and/or degree of curvature may of course be used, and a combination of straight section(s) and linear section(s) (not shown) in gradients may be used, for example without such being a stepped gradient.

Figure 13:
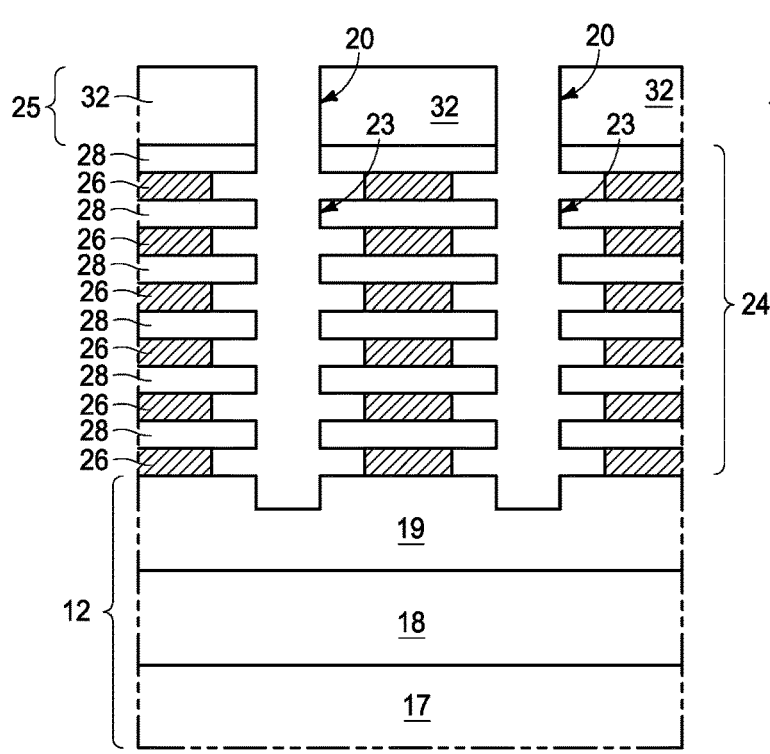
FIG. 13 is a view of the FIG. 6 substrate at a processing step subsequent to that shown by FIG. 6.

Referring to FIG. 13 and in one embodiment, control gate material 26 has been subjected an anisotropic wet etch to laterally recess it relative to the original sidewalls of channel opening 23. Such an etch may be conducted selectively relative to materials 28, 32, and 19. In this document, a selective etch or removal is where one material is removed relative to another stated material at a rate of at least 2:1.

Figure 14:
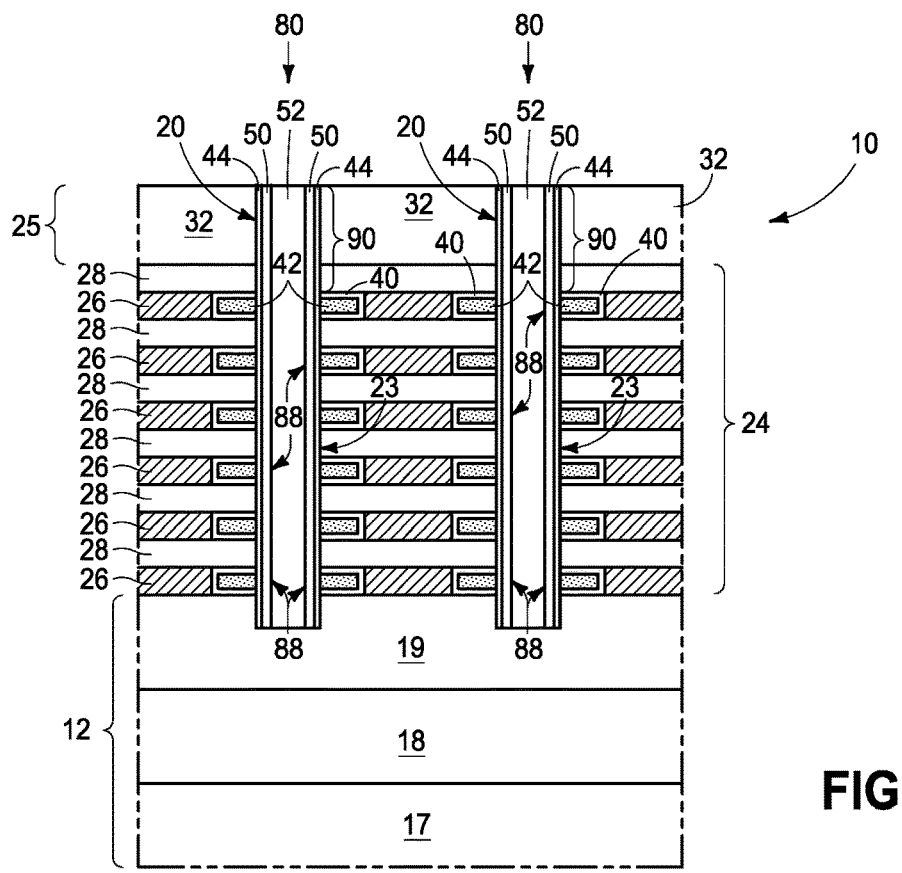
FIG. 14 is a view of the FIG. 13 substrate at a processing step subsequent to that shown by FIG. 13.

Referring to FIG. 14, several acts of processing have occurred relative to FIG. 12. Specifically, control gate blocking insulator 40 (e.g., one or more of silicon nitride, silicon dioxide, hafnium oxide, zirconium oxide, etc.), programmable charge storage material 42 (e.g., material suitable for utilization in floating gates or charge-trapping structures, such as, for example, one or more of silicon, silicon nitride, nanodots, etc.), and tunnel insulator 44 (e.g., one or more of silicon dioxide and silicon nitride), and channel material 50 have been sequentially formed in channel opening 23. Such are shown as having been subjected to an etch (e.g., wet isotropic etch by exposure to at least one of HF and $H_3PO_4$ or by an anisotropic etch) to remove such from being substantially over horizontal surfaces before deposition of the next subsequent layer. Alternately and by way of example only, such may be subjected to such etching after deposition of two or more such layers, where for example a goal is for a subsequently deposited channel material to electrically couple with source material 19. Regardless, and in one embodiment, silicon nitride-comprising region 32 has been exposed to at least one of HF and $H_3PO_4$ at least before forming control gate blocking insulator 40 to preclude it from shielding sidewalls of the elevationally-outermost portion of region 32 within opening 20 to exposure to such at least one of HF and $H_3PO_4$.

Regardless, channel material 50 and a dielectric material 52 (e.g., silicon nitride and/or doped or undoped silicon dioxide) have been formed to fill remaining volume of channel opening 23, followed by planarizing materials 50 and 52 back at least to an elevationally-outermost surface of silicon nitride-comprising region 32. Accordingly, channel material 50 is shown as comprising a channel pillar in channel opening 23 in the form of a hollow channel pillar internally filled with dielectric material 52. Alternately, channel material 50 may extend completely diametrically across channel opening 23 (e.g., no internal dielectric material 52 and not shown) thereby forming a non-hollow channel pillar. Regardless, channel material 50 ideally comprises doped semiconductive material (e.g., polysilicon) having channel conductivity-modifying dopant(s) present in a quantity that produces intrinsic semiconductor properties enabling the channel material to operably function as switchable "on" and "off" channels for the individual memory cells for control gate voltage above and below, respectively, a suitable threshold voltage ($V_t$) depending on programming state of the charge storage transistor for the respective individual memory cell. An example such dopant quantity is $5 \times 10^{17}$ atoms/cm$^3$ to $5 \times 10^{18}$ atoms/cm$^3$. Channel material 50 may be p-type or n-type.

FIG. 14 shows formation of elevationally-extending strings 80 of individual memory cells 88. Construction 10 is shown as comprising a single memory cell 88 about the channel pillar in each tier of the elevationally-extending strings of memory cells. Alternately, and by way of example only, any existing or yet-to-be-developed construction may be used wherein two or more memory cells are circumferentially spaced about the channel pillar in a single tier in a given string (not shown). Regardless, example memory cells 88 comprise a programmable charge storage transistor comprising materials 50, 44, 42, 40, and 26, and in one embodiment as shown extend elevationally.

The above-described processing was by way of example with respect to so-called "gate first" processing in comparison to so-called "gate last" or "replacement gate" processing. However, gate last/replacement gate processing may be used whereby a FIG. 1-starting-construction may be with a material 24 comprising alternating tiers of different composition insulating materials (i.e., no control gate material 26 yet) with one of such insulating materials being replaced with control gate material 26 after forming the control gate blocking insulator, the programmable charge storage material, the tunnel insulator, and the channel material in channel opening 23. However as referred to above, processing in accordance with the invention may occur with respect to a silicon nitride-comprising material regardless of resulting integrated circuit construction, and may occur where the resulting construction does not include integrated circuitry.

Embodiments of the invention encompass an elevationally-extending string of memory cells individually comprising a programmable charge storage transistor independent of method of manufacture. Nevertheless, any such string of memory cells may include any of the structural aspects described above with respect to method embodiments. Embodiments of elevationally-extending strings (e.g., 80) of memory cells (e.g., 88) individually comprising a programmable charge storage transistor (e.g., encompassed by materials 50, 44, 42, 40, and 26 in an individual tier) in accordance with structure embodiments of the invention may comprise vertically-alternating tiers of insulative material (e.g., 28) and control gate material (e.g., 26). A channel pillar (e.g., material 50) extends elevationally through multiple of the vertically-alternating tiers and comprises a projecting portion (e.g., 90 in FIG. 14) extending elevationally outward of the elevationally-outermost tier of control gate material. Tunnel insulator (e.g., 44), programmable charge storage material (e.g., 42), and control gate blocking insulator (e.g., 40) are between the channel pillar and the control gate material of individual of the tiers of the control gate material. A silicon nitride-comprising region (e.g., 32) encircles at least some of the projecting portion of the channel pillar (e.g., that portion of projecting portion 90 that is above elevationally-outmost insulating material 28 as shown).

In one embodiment, the encircling silicon nitride-comprising material comprises an elevationally-outermost portion (e.g., 34/34a/34b/34c/34d/34e) and an elevationally-innermost portion (e.g., 36/36a/36b/36c/36d/36e). The elevationally-outermost portion has greater intrinsic mechanical stress in the tensile direction than does the elevationally-innermost portion. In one embodiment, the intrinsic mechanical stress is constant elevationally through one or both of the elevationally-outermost portion and elevationally-innermost portion, and in one embodiment is variable elevationally through one or both of the elevationally-outermost portion and elevationally-innermost portion. In one embodiment, the elevationally-outermost portion has intrinsic mechanical stress, and in one embodiment the elevationally-innermost portion has intrinsic tensile mechanical stress. Any other attribute(s) or aspect(s) as shown and/or described above may be used.

In one embodiment, the encircling silicon nitride-comprising material comprises an elevationally-innermost portion comprising carbon, and comprises an elevationally-outermost portion having less carbon content, if any, than the elevationally-innermost portion. In one embodiment, the carbon content is constant elevationally through one or both elevationally-outermost portion and the elevationally-innermost portion, and in one embodiment is variable elevationally through one or both elevationally-outermost portion and the elevationally-innermost portion. In one embodiment, the elevationally-innermost portion has 0.5 to 9 atomic percent carbon in one embodiment 0.5 to 2 atomic percent carbon, and in one embodiment 0 to 0.001 atomic percent carbon. In one embodiment, the difference in said carbon content is along a stepped gradient, and in one embodiment along a linear gradient. Any other attribute(s) or aspect(s) as shown and/or described above may be used.

In one embodiment, the encircling silicon nitride-comprising material comprises an elevationally-outermost portion comprising boron and an elevationally-innermost portion having less boron content, if any, than the elevationally-outermost portion. In one embodiment, the boron content is constant elevationally through the elevationally-outermost portion and the elevationally-innermost portion, and in one embodiment is variable through such portions. In one embodiment, the elevationally-outermost portion has 1 to 20 atomic percent boron, and in one embodiment 0 to 0.1 atomic percent boron. In one embodiment, difference in boron content between the elevationally-outermost and elevationally-innermost regions is along a stepped gradient, and in one embodiment is along a linear gradient. Any other attribute(s) or aspect(s) as shown and/or described above may be used.

CONCLUSION

In some embodiments, a method comprises forming material to be etched over a substrate. An etch mask comprising a silicon nitride-comprising region is formed elevationally over the material. The etch mask comprises an elevationally-extending mask opening in the silicon nitride-comprising region that has a minimum horizontal open dimension that is greater in an elevationally-innermost portion of the region than in an elevationally-outermost portion of the region. The elevationally-outermost portion has a greater etch rate in at least one of HF and $H_3PO_4$ than does the elevationally-innermost portion. The etch mask is used as a mask while etching an elevationally-extending mask opening into the material. The silicon nitride-comprising region is exposed to at least one of HF and $H_3PO_4$ to increase the minimum horizontal open dimension in the elevationally-outermost portion to a greater degree than increase, if any, in the minimum horizontal open dimension in the elevationally-innermost portion.

In some embodiments, an elevationally-extending string of memory cells individually comprising a programmable charge storage transistor comprises vertically-alternating tiers of insulative material and control gate material. A channel pillar extends elevationally through multiple of the vertically-alternating tiers and comprises a projecting portion extending elevationally outward of the elevationally-outermost tier of control gate material. Tunnel insulator, programmable charge storage material, and control gate blocking insulator is between the channel pillar and the control gate material of individual of the tiers of the control gate material. Silicon nitride-comprising material encircles at least some of the projecting portion of the channel pillar. The encircling silicon nitride-comprising material comprises an elevationally-outermost portion and an elevationally-innermost portion. The elevationally-outermost portion has greater intrinsic mechanical stress in the tensile direction than does the elevationally-innermost portion.

In some embodiments, an elevationally-extending string of memory cells individually comprising a programmable charge storage transistor comprises vertically-alternating tiers of insulative material and control gate material. A channel pillar extends elevationally through multiple of the vertically-alternating tiers and comprises a projecting portion extending elevationally outward of the elevationally-outermost tier of control gate material. Tunnel insulator, programmable charge storage material, and control gate blocking insulator is between the channel pillar and the control gate material of individual of the tiers of the control gate material. Silicon nitride-comprising material encircles at least some of the projecting portion of the channel pillar. In some embodiments, the encircling silicon nitride-comprising material comprises an elevationally-innermost portion comprising carbon and an elevationally-outermost portion having less carbon content, if any, than the elevationally-innermost portion. In some embodiments, the encircling silicon nitride-comprising material comprises an elevationally-outermost portion comprising boron and an elevationally-innermost portion having less boron content, if any, than the elevationally-outermost portion.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. An elevationally-extending string of memory cells individually comprising a programmable charge storage transistor, comprising:
   vertically-alternating tiers of insulative material and control gate material;
   a channel pillar extending elevationally through multiple of the vertically-alternating tiers and comprising a projecting portion extending elevationally outward of the elevationally-outermost tier of control gate material;
   tunnel insulator, programmable charge storage material, and control gate blocking insulator between the channel pillar and the control gate material of individual of the tiers of the control gate material; and
   silicon nitride-comprising material encircling at least some of the projecting portion of the channel pillar, the encircling silicon nitride-comprising material comprising an elevationally-outermost portion and an elevationally-innermost portion, the elevationally-outermost portion having greater intrinsic mechanical stress in the tensile direction than does the elevationally-innermost portion, the elevationally-outermost portion and the elevationally-innermost portion being directly against one another and difference in said intrinsic mechanical stress being along a stepped gradient.

2. The string of memory cells of claim 1 wherein said intrinsic mechanical stress is constant elevationally through each of the elevationally-outermost portion and the elevationally-innermost portion.

3. The string of memory cells of claim 1 wherein the elevationally-outermost portion has intrinsic tensile mechanical stress.

4. The string of memory cells of claim 3 wherein the elevationally-innermost portion has intrinsic tensile mechanical stress.

5. An elevationally-extending string of memory cells individually comprising a programmable charge storage transistor, comprising:
   vertically-alternating tiers of insulative material and control gate material;
   a channel pillar extending elevationally through multiple of the vertically-alternating tiers and comprising a projecting portion extending elevationally outward of the elevationally-outermost tier of control gate material;
   tunnel insulator, programmable charge storage material, and control gate blocking insulator between the channel pillar and the control gate material of individual of the tiers of the control gate material; and silicon nitride-comprising material encircling at least some of the projecting portion of the channel pillar, the encircling silicon nitride-comprising material comprising an elevationally-innermost portion comprising carbon, the encircling silicon nitride-comprising material comprising an elevationally-outermost portion having less carbon content, if any, than the elevationally-innermost portion, the elevationally-outermost portion and the elevationally-innermost portion being directly against one another and difference in said carbon content being along a stepped gradient.

6. The string of memory cells of claim 5 wherein said carbon content is constant elevationally through each of the elevationally-outermost portion and the elevationally-innermost portion.

7. The string of memory cells of claim 5 wherein the elevationally-innermost portion has 0.5 to 9 atomic percent carbon.

8. The string of memory cells of claim 7 wherein the elevationally-innermost portion has 0.5 to 2 atomic percent carbon.

9. The string of memory cells of claim 5 wherein the elevationally-outermost portion has zero to 0.001 atomic percent carbon.

10. An elevationally-extending string of memory cells individually comprising a programmable charge storage transistor, comprising:

vertically-alternating tiers of insulative material and control gate material;

a channel pillar extending elevationally through multiple of the vertically-alternating tiers and comprising a projecting portion extending elevationally outward of the elevationally-outermost tier of control gate material;

tunnel insulator, programmable charge storage material, and control gate blocking insulator between the channel pillar and the control gate material of individual of the tiers of the control gate material; and silicon nitride-comprising material encircling at least some of the projecting portion of the channel pillar, the encircling silicon nitride-comprising material comprising an elevationally-outermost portion and an elevationally-innermost portion, the elevationally-outermost portion comprising at least two of (a), (b), and (c), where,
 (a) greater intrinsic mechanical stress in the tensile direction than the elevationally-innermost portion;
 (b) less carbon content, if any, than the elevationally-innermost portion; and
 (c) more boron content than in the elevationally-innermost portion, if any in the elevationally-innermost portion.

11. The string of memory cells of claim 10 wherein the elevationally-outermost portion comprises all of (a), (b), and (c).

* * * * *